(12) United States Patent
Suzuki (10) Patent No.: US 8,331,104 B2
(45) Date of Patent: Dec. 11, 2012

(54) ELECTRONIC DEVICE AND CIRCUIT BOARD

(75) Inventor: Daigo Suzuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 218 days.

(21) Appl. No.: 12/905,843

(22) Filed: Oct. 15, 2010

(65) Prior Publication Data

US 2011/0188215 A1 Aug. 4, 2011

(30) Foreign Application Priority Data

Jan. 29, 2010 (JP) ................................. 2010-019221

(51) Int. Cl.
H05K 7/00 (2006.01)

(52) U.S. Cl. ........ 361/777; 174/250; 174/255; 174/257; 174/261; 174/267; 257/200; 257/773; 257/774; 257/667

(58) Field of Classification Search .................. 361/777; 174/250, 255, 257, 261, 264; 257/200, 773, 257/774, 667
See application file for complete search history.

(56) References Cited

U.S. PATENT DOCUMENTS

| | | |
|---|---|---|
| 2003/0196749 A1 | 10/2003 | Japp et al. |
| 2007/0222052 A1 | 9/2007 | Kabumoto |
| 2008/0156523 A1 | 7/2008 | Saito |
| 2009/0027144 A1 | 1/2009 | Saito |

FOREIGN PATENT DOCUMENTS

| | | |
|---|---|---|
| JP | 3-2279 | 1/1991 |
| JP | 07-321463 | 12/1995 |
| JP | 8-506696 | 7/1996 |
| JP | 2000-323840 | 11/2000 |
| JP | 2003-17613 | 1/2003 |
| JP | 2006-074014 | 3/2006 |
| JP | 2007-141990 | 6/2007 |
| JP | 2007-288180 | 11/2007 |
| JP | 2007-311510 | 11/2007 |
| JP | 2008-166357 | 7/2008 |
| JP | 2009-032874 | 2/2009 |
| JP | 2009-054876 | 3/2009 |
| WO | WO 94-18812 | 8/1994 |

OTHER PUBLICATIONS

Japanese Patent Application No. 2010-019221; Notice of Reasons for Rejection; Mailed Nov. 1, 2011 (English translation).
Japanese Patent Application No. 2010-019221; Notice of Reasons for Rejection; Mailed Jun. 21, 2011 (English translation).
Japanese Patent Application No. 2010-019221; Notice of Reasons for Rejection; Mailed Feb. 1, 2011 (English translation).

*Primary Examiner* — Xiaoliang Chen
(74) *Attorney, Agent, or Firm* — Blakely, Sokoloff, Taylor & Zafman LLP (57) ABSTRACT

According to one embodiment, an electronic device includes a circuit board housed in a housing. The circuit board further includes a conductive layer, an insulating layer and a signal line. The conductive layer includes a base portion including a surface, a plurality of first projecting portions formed integrally with the base portion and extending in parallel with each other on the surface of the base portion, and a plurality of second projecting portions formed integrally with the base portion and extending in parallel with each other to cross the plurality of first projecting portions. The insulating layer is stacked on the conductive layer to cover the surface of the base portion, and the signal line is stacked on the insulating layer and extends in a direction crossing directions in which the first and second projecting portions extend.

10 Claims, 8 Drawing Sheets

ELECTRONIC DEVICE AND CIRCUIT BOARD

CROSS-REFERENCE TO RELATED APPLICATIONS

This application is based upon and claims the benefit of priority from Japanese Patent Application No. 2010-019221, filed Jan. 29, 2010; the entire contents of which are incorporated herein by reference.

FIELD

Embodiments described herein relate generally to a circuit board in which a conductive layer and a signal line face each other via an insulating layer. Further, embodiments described herein relate generally to an electronic device comprising the circuit board.

BACKGROUND

Electronic devices such as portable computers include a circuit board and electronic parts mounted on the circuit board. The electronic parts include, for example, LSI. The circuit board is provided with a number of signal lines which form a circuit.

In the case where signals to be input to the electronic parts and signals to be output from the electronic parts are of high frequencies, a signal line through which these signals pass has a resistance and an inductance. Therefore, characteristic impedance is created in the signal line.

In the case where the impedance of an electronic part and the characteristic impedance of the signal line are different from each other, the signal reflects at the junction between the electronic part and the signal line, thereby generating noise. In order to prevent the generation of noise, the characteristic impedance of the signal line and the impedance of the electronic part need to be matched with each other.

The characteristic impedance of the signal line is determined by the width of the signal line and the thickness of the insulating layer between the reference layer and the signal line. The reference layer is, for example, a ground layer or a power layer. As the width of the signal line is narrowed, the characteristic impedance increases. As the thickness of the insulating layer is reduced, the characteristic impedance decreases. In accordance with the impedance value of the electronic part, the width of the signal line and the thickness of the insulating layer are determined. In this manner, the impedance of the electronic part and the characteristic impedance of the signal line are matched with each other.

Incidentally, with regard to electronic devices such as portable computers, there is a demand for making the devices slim to be easily portable. In such electronic devices, the circuit boards are designed to be thin, and accordingly the insulating films are thin. When the insulation films are thin, the characteristic impedance of the signal line is low. Here, in order to match the impedance of the electronic part and the characteristic impedance of the signal line with each other, the characteristic impedance should be increased by reducing the width of the signal line.

However, it is technical difficult to narrow the signal line further once the width is reduced to a certain level. As a solution to this, in the circuit board disclosed in Jpn. Pat. Appln. KOKAI Publication No. 2007-141990, a plurality of perforations are made in the ground layer. The perforated ground layer formed into a mesh state has a smaller area in which the signal lines and the reference layer face each other.

With this structure, even in the case of a signal having a large width, the impedance of the electronic part and the characteristic impedance of the signal line can be matched with each other.

Further, when a signal passes through a signal line, a return current flows in the ground layer in the direction opposite to the signal passing direction. In the circuit board disclosed in Jpn. Pat. Appln. KOKAI Publication No. 2007-141990, the perforations are made in the ground layer. With this structure, the return current detours the perforations when flowing the mesh ground layer.

As described above, the return current travels a longer distance than that of the signal passing through the signal line. Therefore, the return current delays with respect to the signal. When the return current delays, the signal recognition error may occur. Thus, circuit boards thinned and impedance-matched with electronic parts are susceptible to improvement.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

DETAILED DESCRIPTION

Various embodiments will be described hereinafter with reference to the accompanying drawings.

In general, according to one embodiment, an electronic device includes a circuit board housed in a housing. The circuit board further includes a conductive layer, an insulating layer and a signal line. The conductive layer includes a base portion including a surface, a plurality of first projecting portions formed integrally with the base portion and extending in parallel with each other on the surface of the base portion, and a plurality of second projecting portions formed integrally with the base portion and extending in parallel with each other to cross the plurality of first projecting portions. The insulating layer is stacked on the conductive layer to cover the surface of the base portion, and the signal line is stacked on the insulating layer and extends in a direction crossing directions in which the first and second projecting portions extend.

The first embodiment will now be described with reference to FIGS. 1 to 5.

Figure 1:
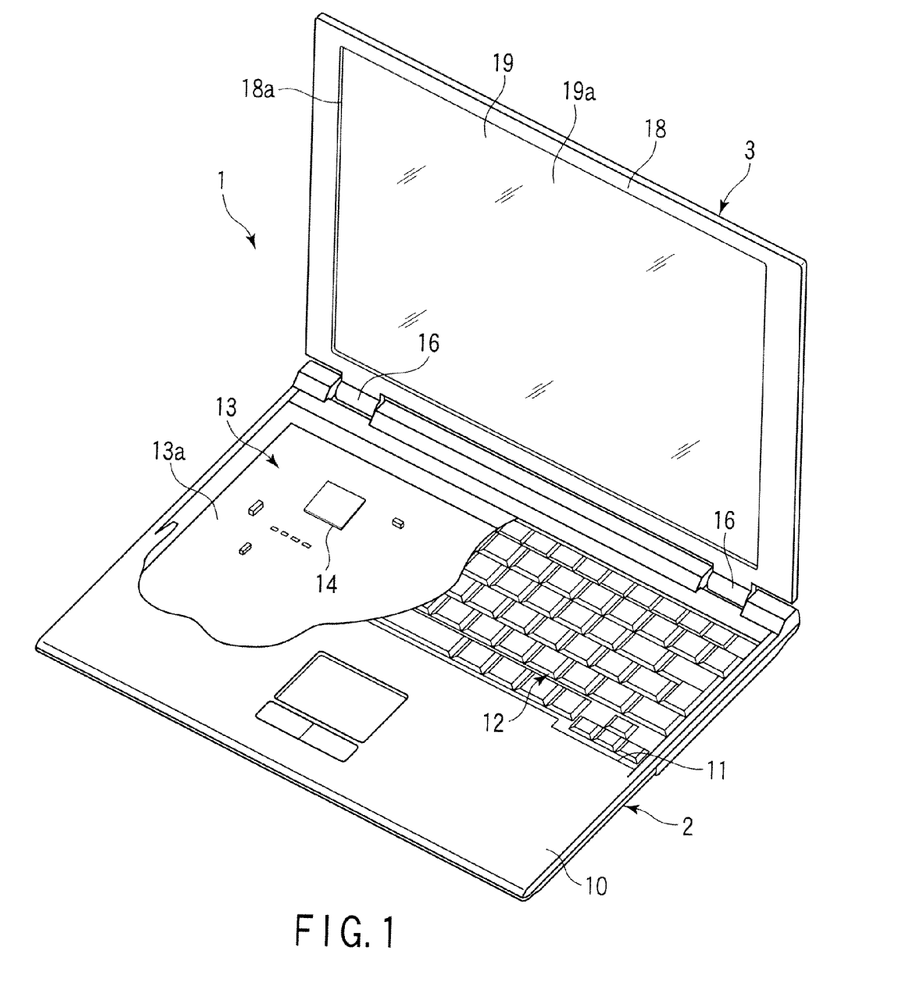
FIG. 1 is an exemplary partially cut-away perspective view showing a portable computer according to the first embodiment.

FIG. 1 is a partially cut-away perspective view showing a portable computer 1. The portable computer 1 is an example of the electronic device. As shown in FIG. 1, the portable computer 1 includes a computer main body 2 and a display unit 3.

The computer main body 2 includes a flat box-shaped main housing 10. The main housing 10 is an example of the housing. A keyboard mount portion 11 is formed on the upper surface of the main housing 10. A keyboard 12 is supported on the keyboard mount portion 11.

A circuit board 13 is housed inside the main housing 10. The circuit board 13 is, for example, a rigid printed circuit board. On a component side 13a of the circuit board 13, a ball grin array (BGA) 14 is mounted. The BGA 14 is an example of the electronic part.

The display unit 13 is connected to a rear end of the computer main body 2 via a pair of hinge portions 16. The display unit 3 is made pivotable between a closed position and an open position around the hinge portions 16 as axis. In the closed position, the display unit 3 is lied on the main body 2 of the computer, whereas in the open position, the display unit 3 stands upright from the rear end of the main body 2.

The display unit 3 includes a display housing 18 having a flat box shape, and a display module 19 housed in the display housing 18. The display module 19 is, for example, a liquid crystal display. The display housing 18 includes a front face, in which a display opening portion 18a is made. The display opening portion 18a exposes a screen 19a of the display module 19 to the outside of the display housing unit 3.

Figure 2:
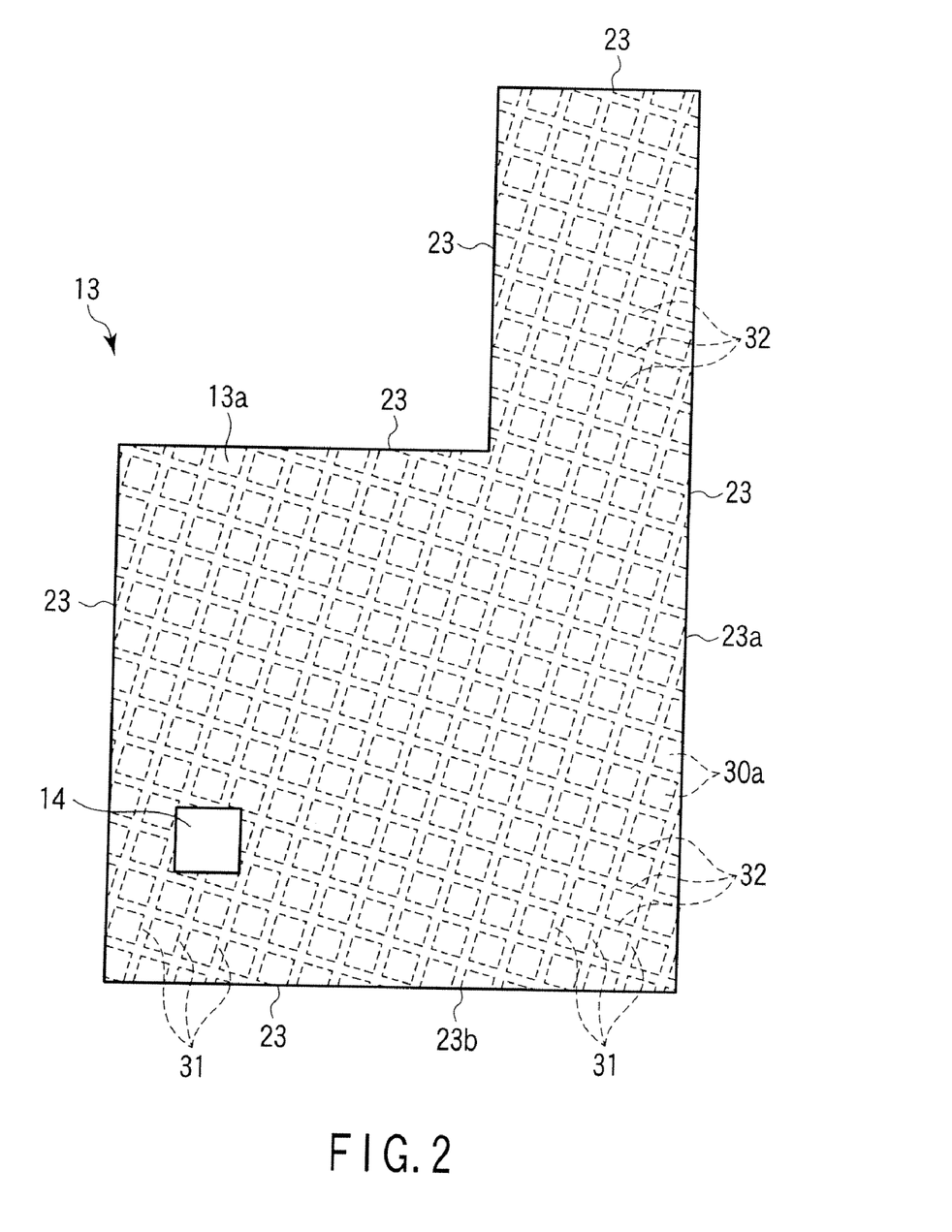
FIG. 2 is an exemplary plan view showing a circuit board according to the first embodiment.

FIG. 2 is a plan view showing the circuit board 13. The circuit board 13 includes a plurality of edge portions 23. On the component side 13a of the circuit board 13, various types of signals lines and electronic parts are provided though they are not illustrated in the figure in addition to the BGA 14 shown in FIG. 2.

Figure 3:
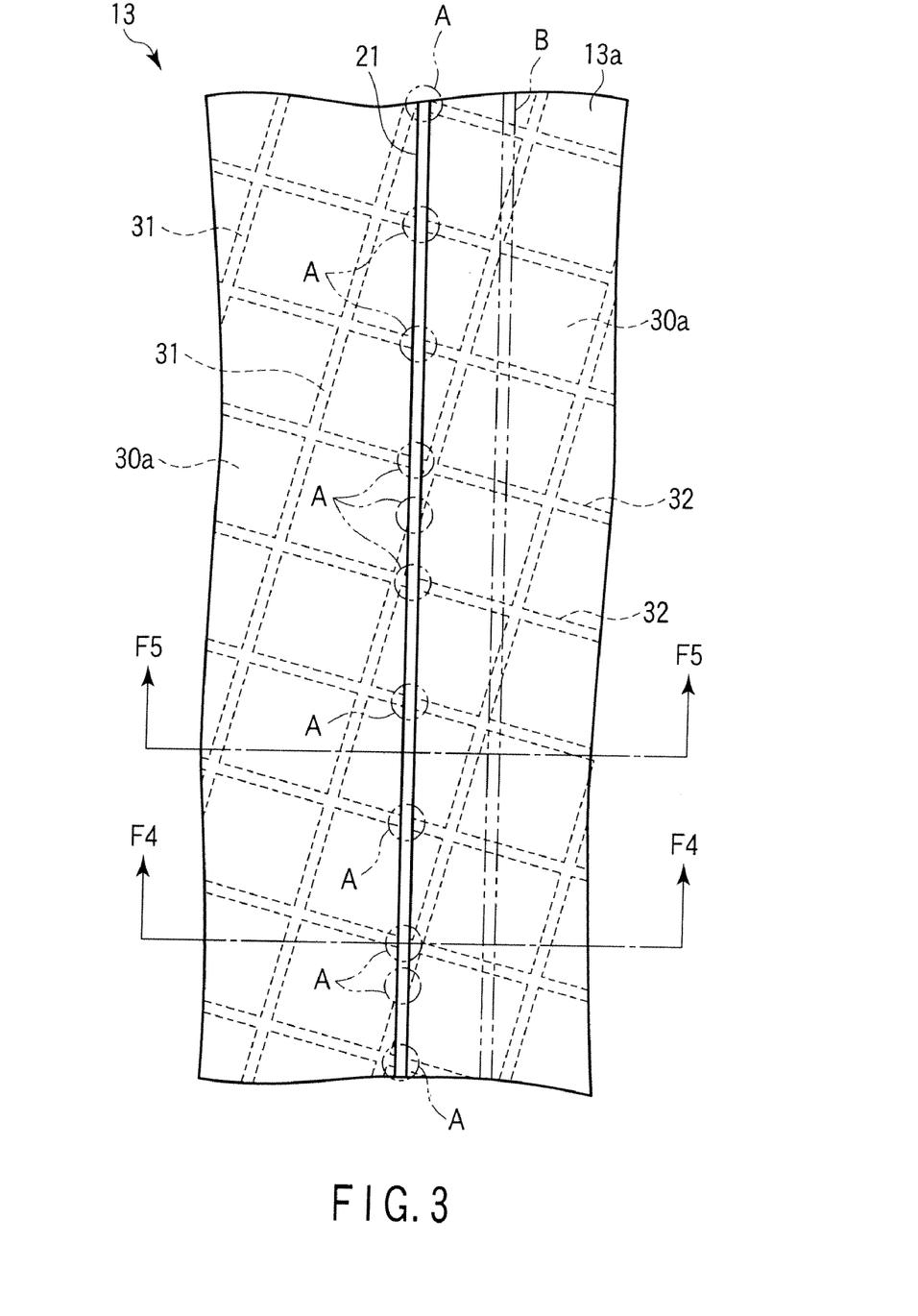
FIG. 3 is an exemplary enlarged plan view showing the circuit board of the first embodiment.

FIG. 3 is a partially enlarged plan view of the circuit board 13. As shown in FIG. 3, the circuit board 13 includes a signal line 21 provided on the component side 13a. The signal line 21 is electrically connected to the BGA 14 shown in FIG. 2.

Figure 4:
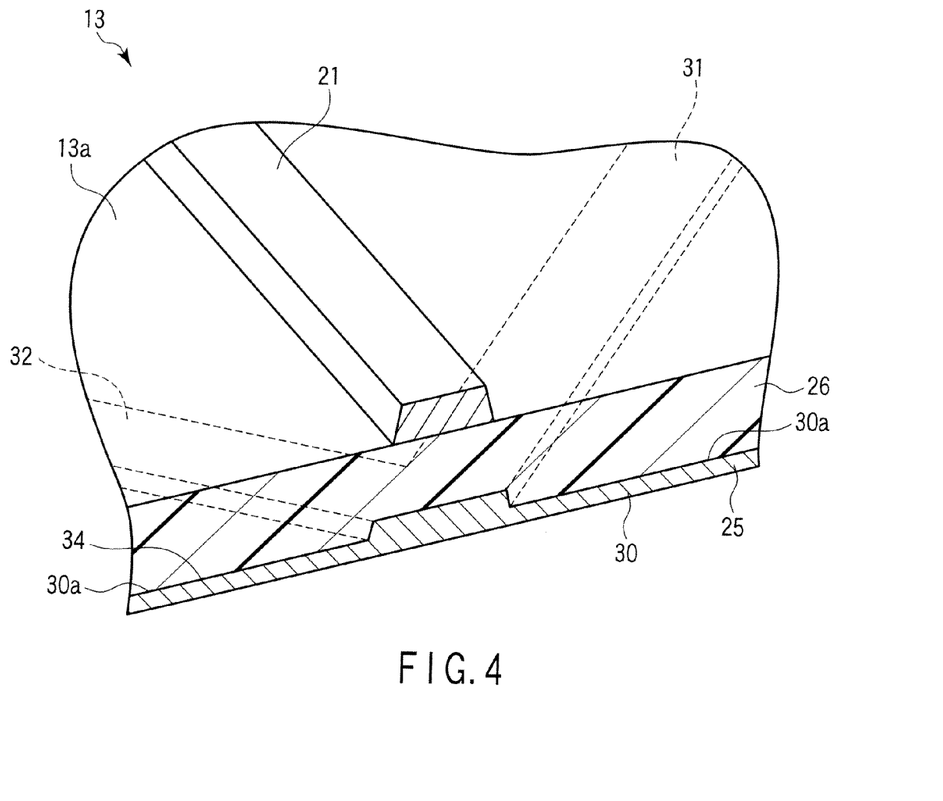
FIG. 4 is an exemplary perspective view of the circuit board taken along the line F4-F4 of FIG. 3.

FIG. 4 is a perspective view showing a cross section of the circuit board 13 taken along the line F4-F4 of FIG. 3. As shown in FIG. 4, the circuit board 13 includes a ground layer 25 and an insulating layer 26. The ground layer 25 is an example of the conductive layer. The insulating layer 26 is formed of, for example, a glass-epoxy material and it has rigidity.

The ground layer 25 includes a base portion 30, a plurality of first projecting portions 31 and a plurality of second projecting portions 32. The base portion 30, the first projecting portions 31 and the second projecting portions 32 are provided as an integral unit. The base portion 30 includes the first surface 34 and the second surface 35 (shown in FIG. 5). The first surface 34 is an example of the surface. The second surface 35 is located on the opposite side to the first surface 34.

The plurality of first projecting portions 31 each project from the first surface 34 of the base portion 30. As shown in FIG. 2, the plurality of first projecting portions 31 each extend in parallel with each other on the first surface 34.

The plurality of first projecting portions 31 each extend in a direction which obliquely crosses with the edge portions 23 of the circuit board 13. For example, the first projecting portions 31 extend in a direction crossing at an angle 15 degrees with respect to a front edge portion 23a of the circuit board 13.

As shown in FIG. 4, the plurality of second projecting portions 32 each project from the first surface 34 of the base portion 30. As shown in FIG. 2, the plurality of second projecting portions 32 each extend in parallel with each other on the first surface 34.

As shown in FIG. 3, the plurality of second projecting portions 32 cross with the plurality of first projecting portions 31, respectively. The second projecting portions 32 and the first projecting portions 31 are arranged in lattice. A plurality of recess portions 30a, each of which is surrounded by the respective first and second projecting portions 31 and 32, are formed in the base portion 30. Each recess portion 30a is formed into, for example, a square shape.

As shown in FIG. 2, the second projecting portions 32 extend in a direction which obliquely crosses with the edge portions 23 of the circuit board 13. For example, the second projecting portions 32 extend in a direction crossing at an angle 15 degrees with respect to a side edge portion 23b of the circuit board 13.

The first projecting portions 31 and second projecting portions 32 each extend from one edge portion 23 of the circuit board 13 to another edge portion 23. In other words, the first projecting portions 31 and second projecting portions 32 arranged in lattice are provided over the entire region of the component side 13a of the circuit board 13. The first projecting portions 31 and second projecting portions 32 are formed by, for example, carrying out half-etching on a copper foil material which gives rise to the ground layer 25.

Figure 5:
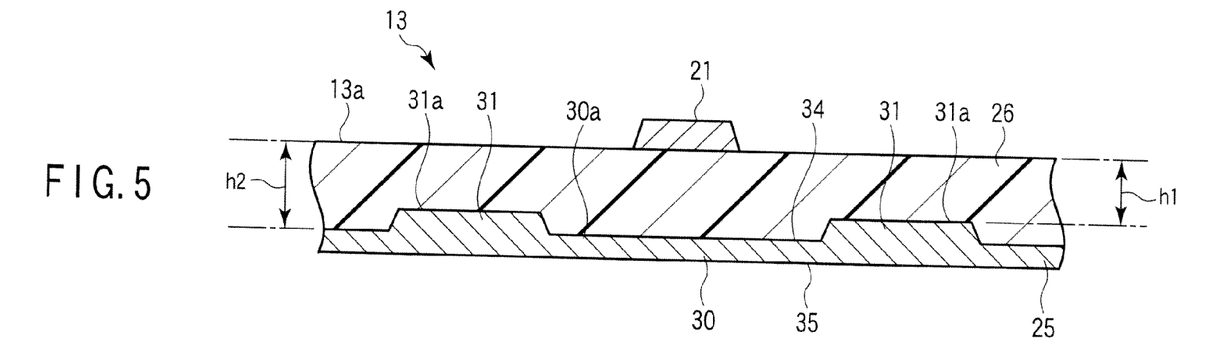
FIG. 5 is an exemplary cross-sectional view of the circuit board taken along the line F5-F5 of FIG. 3.

FIG. 5 is a cross-sectional view of the circuit board 13 taken along the line F5-F5 of FIG. 3. The height from the second surface 35 of the base portion 30 shown in FIG. 5 to the top portion 31a of the first projecting portion 31 is, for example, 30 μm. Note that the height from the second surface 35 of the base portion 30 to the top portion of the second projecting portion 32 is 30 μm as well.

The height from the second surface 35 of the base portion 30 to the first surface 34 is, for example, 15 μm. The width of each of the first projecting portions 31 and second projecting portions 32 is, for example, 75 μm. The length of one side of each recess portion 30a of the base portion 30 is, for example, 675 μm.

As shown in FIG. 4, the insulating layer 26 is overlaid on the ground layer 25 such as to cover the first surface 34 of the base portion 30. The insulating layer 26 is overlaid on the ground layer 25 while tightly attaching to the base portion 30, the first projecting portions 31 and the second projecting portions 32.

The first thickness h1 of the insulating layer 26 shown in FIG. 5 is, for example, 40 μm. The first thickness h1 is the thickness of a portion of the insulating layer 26 overlaid on the first and second projecting portions 31 and 32. The second thickness h2 of the insulating layer 26 is, for example, 55 μm. The second thickness h2 is the thickness of a portion of the insulating layer 26 overlaid on the recess portions 30a.

The signal line 21 is provided on the component side 13a of the circuit board 13. The signal line 21 is stacked on the insulating layer 26 from the opposite side of the ground layer 25. As shown in FIG. 3, the signal line 21 extends in a direction crossing the direction in which first and second projecting portions 31 and 32 extend. For example, the signal line 21 extends in the direction at an angle of 0, 45, 90 or 135 degree with respect to the front edge portion 23a of the circuit board 13. The thickness of the signal line 21 is, for example, 40 μm.

In the circuit board 13 of the above-described structure, the characteristic impedance Z0 of the signal line 21 is obtained by, for example, the following formula: Expression 1.

$$Z0 = \frac{h}{w} \cdot \frac{377}{\sqrt{\varepsilon}\left\{1 + \frac{2h}{\pi w}\left(1 + \ln\frac{\pi w}{h}\right)\right\}} \quad \text{(Expression 1)}$$

The formula of Expression 1 is an example of the experimental formula for obtaining the characteristic impedance in the microstrip. In the formula of Expression 1, h represents the thickness of the insulating layer 26, w represents the width of the signal line 21 and ∈ represents the execution relative dielectric constant. There are a great number of formulas proposed other than the formula of Expression 1 to obtain the characteristic impedance Z0. A formula other than Expression 1 may be used in order to obtain the characteristic impedance Z0.

From the formula of Expression 1, if the width w of the signal line 21 is fixed at the same value, as the value of the thickness h of the insulating layer 26 is larger, the value of the characteristic impedance Z0 becomes larger. In the meantime, if the value of the thickness h of the insulating layer 26 is fixed at the same value, as the value of the width w of the signal line 21 is larger, the value of the characteristic impedance Z0 becomes smaller.

As shown in FIG. 5, the first thickness h1 and the second thickness h2 mentioned above are both thicknesses of the insulating layer 26. Here, in the circuit board 13 of the above-described structure, a value between the first thickness h1 and the second thickness h2 is applied for the thickness h of the insulating layer 26 in the formula of Expression 1.

That is, the value of the thickness h of the insulating layer 26 in the formula of Expression 1 is larger than the value of the first thickness h1. Further, the value of the thickness h is smaller than the second thickness h2. The value of the thickness h of the insulating layer 26 is determined by conditions such as the interval of the first projecting portions 31, the interval of the second projecting portions 32, the thickness and width of each of the first and second projecting portions 31 and 32.

In the portable computer 1 and circuit board 13 of the above-described structure, a value between the first thickness h1 and the second thickness h2 is applied for the thickness h of the insulating layer 26 used in the formula of Expression 1. In this manner, the thickness h of the insulating layer 26 is larger mathematically as compared to the case where the first and second projecting portions 31 and 32 are not formed.

Therefore, in the case where the circuit board 13 is thinned, the characteristic impedance Z0 of the signal line 21 can be made larger. Thus, even in the case where it is difficult to reduce the width of the signal line 21 smaller than a certain level, the characteristic impedance Z0 of the signal line 21 can be easily adjusted. By adjusting the characteristic impedance Z0 of the signal line 21, this characteristic impedance and the impedance of an electronic part such as BGA 14 are matched.

As shown in FIG. 2, the first projecting portions 31 each extend in a direction crossing at an angle 15 degrees with respect to the front edge portion 23a of the circuit board 13, whereas the second projecting portions 32 each extend in a direction crossing at an angle 15 degrees with respect to the side edge portion 23b of the circuit board 13. On the other hand, the signal line 21 extends in the direction at an angle of 0, 45, 90 or 135 degree with respect to the front edge portion 23a of the circuit board 13.

With this structure, the variance in the characteristic impedance of the signal line 21, which depends on the arrangement of the signal line 21, is prevented. FIG. 3 shows points A each surrounded by a circuit of two-dot chain line.

Each point A is a section where the signal line 21 overlays on either one of the first and second projecting portions 31 and 32 via the insulating layer 26. The number of points A and the area of each point A in the case where the signal line 21 extends in the location shown by solid lines in FIG. 3 are substantially the same as those of the case where the signal line 21 extends in the shifted location B shown by two-dot chain lines in FIG. 3.

Since the first and second projecting portions 31 and 32 are provided on the ground layer 25, the contact area between the ground layer 25 and the insulating layer 26 is increased. With this structure, the separation of the ground layer 25 and the insulating layer 26 from each other is prevented.

The first and second projecting portions 31 and 32 are arranged in lattice over the entire area of the component side 13a of the circuit board 13. With this arrangement, the variance in the characteristic impedance of the signal line 21, which depends on the arrangement of the signal line 21, is prevented.

The ground layer 25 includes a base portion 30. With this structure, a return current, which generates when a signal passes through the signal line 21, flows through the base portion 30. Thus, the delay in the return current with respect to the signal passing through the signal line 21 is prevented.

Since the ground layer 25 includes the base portion 30, the cross sectional area of the ground layer 25 is maintained at a constant size. Therefore, the DC resistance of the ground layer 25 is maintained at a constant level.

It should be noted that the circuit board 13 of this embodiment is a rigid printed wiring board which uses a glass-epoxy material for the insulating layer 26, but the present invention is not limited to this circuit board. For example, the circuit board 13 may be a flexible printed wiring board. In this case, the insulating layer 26 is made of a material having flexibility, such as polyimide.

Further, in this embodiment, the ground layer 25 is an example of the conductive layer. However, the present invention is not limited to this, but, for example, the power source layer may be applied as an example of the conductive layer.

Next, other embodiments will now be described with reference to FIGS. 6 to 9. In these embodiments, structural parts which have the same functions as those of the portable computer 1 and the circuit board 13 of the first embodiment, will be designated by the same reference symbols, and the explanations therefore will not be repeated.

Figure 6:
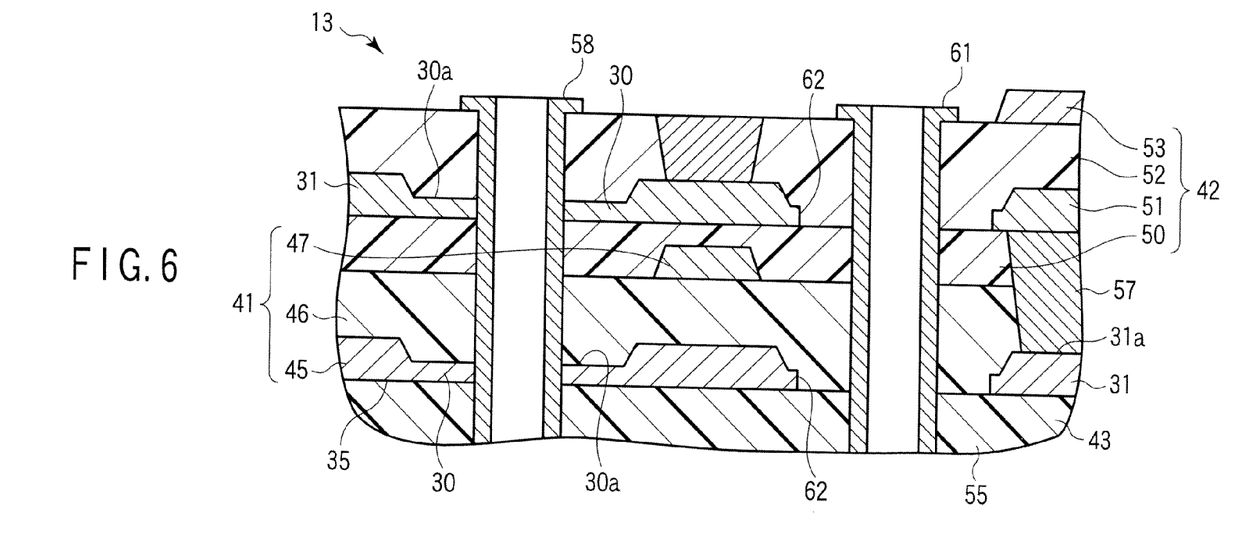
FIG. 6 is an exemplary cross sectional view showing a circuit board according to the second embodiment.

First, the second embodiment will now be described. FIG. 6 is a cross sectional view showing a circuit board 13 according to the second embodiment. As shown in FIG. 6, the circuit board 13 includes a first layer 41, a second layer 42 and a third layer 43. The second layer 42 is an example of the stack layer portion.

The first layer 41 includes a first ground layer 45, a first insulating layer 46 and a first signal line 47. The first ground layer 45 includes a base portion 30, first and second projecting portions 31 and 32 as in the case of the ground layer 25 in the first embodiment. The first insulating layer 46 is stacked on the first ground layer 45 as in the case of the insulating layer 26 in the first embodiment. The first signal line 47 is stacked on the first insulating layer 46 from an opposite side to the first ground layer 45 as in the case of the signal line 21 in the first embodiment.

The second layer 42 includes a second insulating layer 50, a second ground layer 51, a third insulating layer 52 and a second signal line 53. The second insulating layer 50 is stacked on the first insulating layer 46 and the first signal line 47 of the first layer 41.

As in the case of the ground layer 25 in the first embodiment, the second ground layer 51 includes a base portion 30, first and second projecting portions 31 and 32. The second ground layer 51 is stacked on the second insulating layer 50.

As in the case of the insulating layer 26 in the first embodiment, the third insulating layer 52 is stacked on the second ground layer 51. The second signal line 53 is stacked on the third insulating layer 52 from an opposite side to the second ground layer 51 as in the case of the signal line 21 in the first embodiment.

The third layer 43 includes a fourth insulating layer 55. As shown in FIG. 6, the fourth insulating layer 55 is stacked on the first ground layer 45 from a direction of a second surface 35 of the base portion 30 to the first ground layer 45.

An interlayer connection via 57 is provided in the circuit board 13. The interlayer connection via 57 electrically connects the top portion 31a of the first projecting portion 31 of the first layer 41, and the second ground layer 51 of the second layer 42 to each other.

The interlayer connection via 57 is formed by filling a hole which is made through the first insulating layer 46 and the second insulating layer 50 with, for example, a conductive paste. The hole which is made through the first insulating layer 46 and the second insulating layer 50 is made by a drill, and it runs from the surface of the second insulating layer 50 to the top portion 31a of the first projecting portion 31 of the first layer 41.

It should be noted that the interlayer connection via 57 may be formed to electrically connect the top portion of the second projecting portion 32 of the first layer 41, and the second ground layer 51 of the second layer 42 to each other. In this case, the hole which is made through the first insulating layer 46 and the second insulating layer 50 runs from the surface of the second insulating layer 50 to the top portion of the second projecting portion 32 of the first layer 41.

A through connection via 58 is provided in the circuit board 13. The through connection via 58 is made through the first layer 41, the second layer 42 and the third layer 43. The through connection via 58 is formed by applying, for example, metal plate on a hole made through the first layer 41, the second layer 42 and the third layer 43 with a drill.

The through connection via 58 is made through the base portion 30 of the first ground layer 45 of the first layer 41 and the base portion 30 of the second ground layer 51 of the second layer 42. The through connection via 58 electrically connects the first ground layer 45 of the first layer 41 and the second ground layer 51 of the second layer 42 to each other.

As shown in FIG. 6, a via hole 61 is made in the circuit board 13. The via hole 61 is made through the first layer 41, the second layer 42 and the third layer 43. The via hole 61 electrically connects, for example, the signal line provided on the surface of the first layer 41 and the signal line provided on the surface of the third layer 43 to each other.

A clearance hole 62 is made in the base portion 30 of each of the first and second ground layers 45 and 51. The clearance hole 62 is formed by etching the recess portion 30a of the base portion 30, and is made through the base portion 30.

The clearance hole 62 is made to avoid meeting with the via hole 61. In other words, the via hole 61 runs through only the first to fourth insulating layers 46, 50, 52 and 55, and the via hole 61 is insulated from the first and second ground layers 45 and 51.

In the portable computer 1 and circuit board 13 of the above-described structure, the interlayer connection via 57 is formed in the hole made from the surface of the second insulating layer 50 to the top portion 31a of the first projecting portion 31 of the first layer 41. In this manner, the hole opened by a drill is shallow, and therefore the interlayer connection via 57 is easily provided. Consequently, the productivity for the circuit board 13 is enhanced.

The through connection via 58 is made through the base portion 30 of the first ground layer 45 of the first layer 41 and the base portion 30 of the second ground layer 51 of the second layer 42. In other words, the through connection via 58 is made through a section where the metal portion is thin. Therefore, the wear of the drill is suppressed, and as a result, the productivity for the circuit board 13 is enhanced.

The clearance hole 62 is made to avoid meeting with the via hole 61. With this structure, the via hole 61 is insulated from the first and second ground layers 45 and 51.

Figure 7:
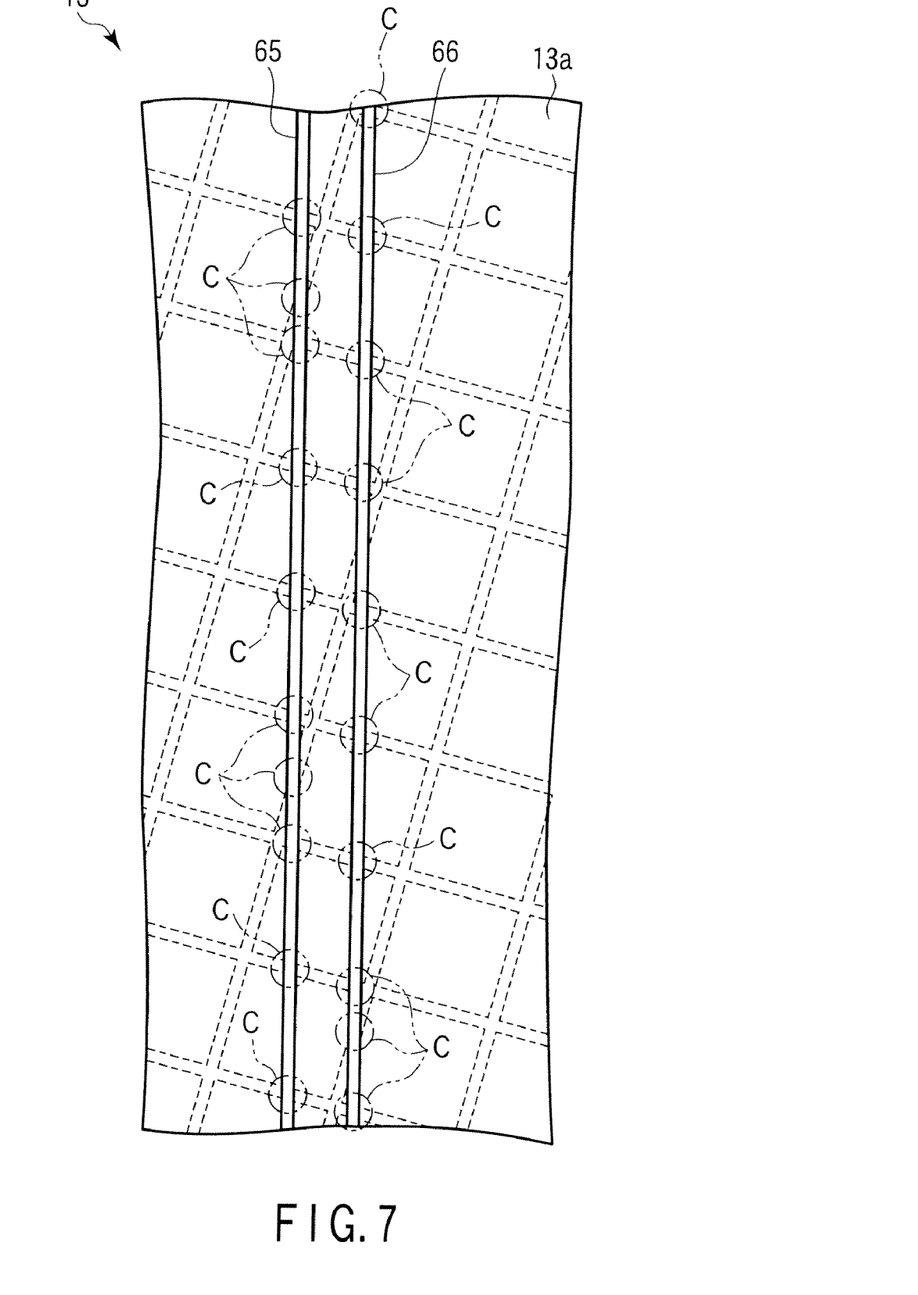
FIG. 7 is an exemplary enlarged plan view showing a circuit board according to the third embodiment.

Next, the third embodiment will now be described. FIG. 7 is a plan view showing a circuit board 13 according to the third embodiment. As shown in FIG. 7, the circuit board 13 includes a pair of differential transmission paths 65 and 66 provided on the component side 13a. The differential transmission paths 65 and 66 are included in the signal line provided on the component side 13a of the circuit board 13.

The pair of differential transmission paths 65 and 66 are provided to extend in parallel with each other. As in the case of the signal line 21 of the first embodiment, the pair of differential transmission paths 65 and 66 extend in the direction at an angle of 0, 45, 90 or 135 degree with respect to the front edge portion 23a of the circuit board 13 shown in FIG. 2.

In the portable computer 1 and circuit board 13 of the above-described structure, the characteristic impedances of the pair of differential transmission paths 65 and 66 are made substantially equal to each other. FIG. 7 shows points C each surrounded by a circuit of two-dot chain line. Each point C is a section where the pair of differential transmission paths 65 and 66 overlay on either one of the first and second projecting portions 31 and 32 via the insulating layer 26. The number of points C and the area of each point C in the case of the differential transmission path 65 are substantially the same as those of the case of the differential transmission path 66.

Next, the fourth embodiment will now be described. In this embodiment, structural parts which have the same functions as those of the portable computer 1 and the circuit board 13 of the second embodiment, will be designated by the same reference symbols, and the explanations therefore will not be repeated.

Figure 8:
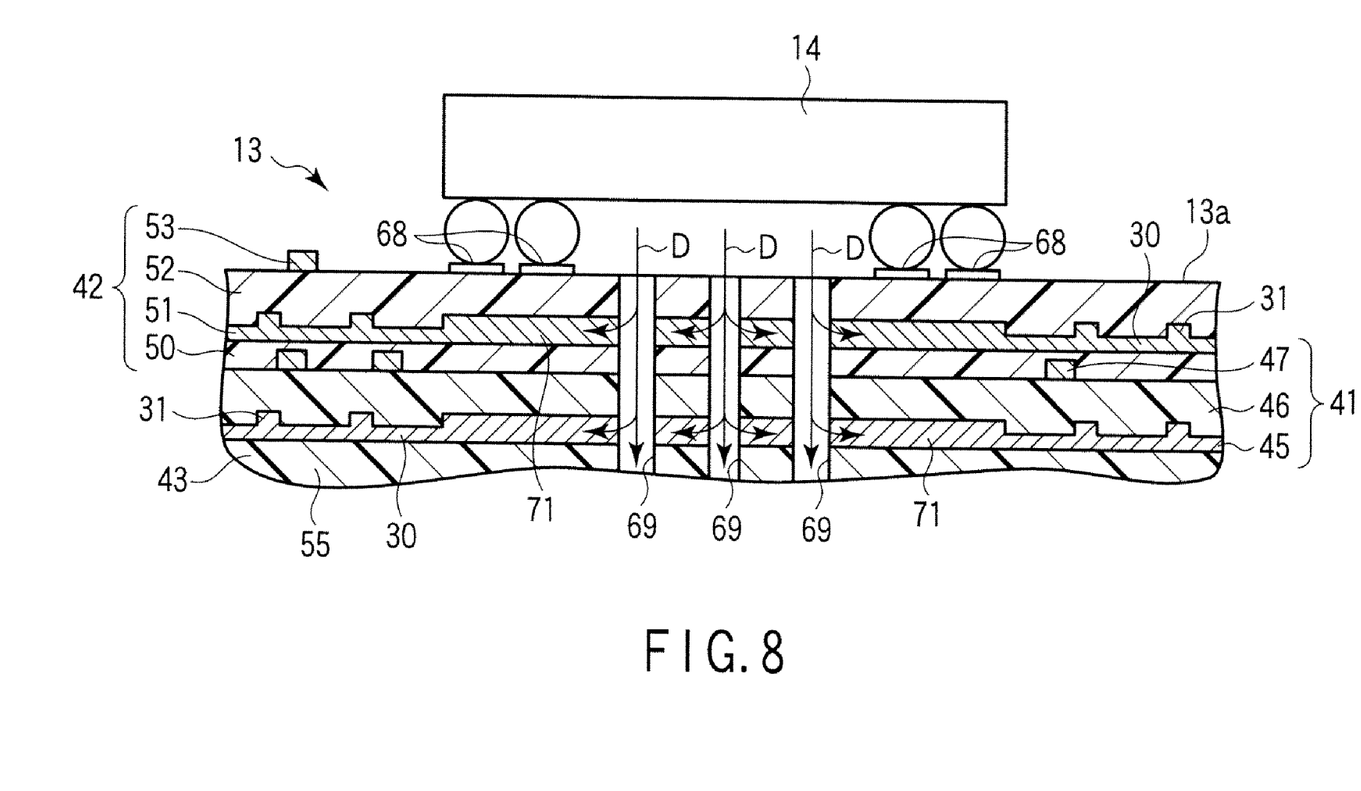
FIG. 8 is an exemplary cross sectional view showing a circuit board according to the fourth embodiment.

FIG. 8 is a cross sectional view showing a circuit board 13 according to the fourth embodiment. As shown in FIG. 8, a plurality of pads 68 are provided on the surface of the second layer 42. A BGA 14 are soldered to the pads 68.

A plurality of holes 69 are made in the circuit board 13. The holes 69 are opened in the section of the circuit board 13, a surface of which is covered by the BGA 14. The holes 69 are over the first layer 41, the second layer 42 and the third layer 43, and they run through the first to fourth insulating layers 46, 50, 52 and 55 and the first and second grounds 45 and 51.

The first and second grounds 45 and 51 each include a heat conducting portion 71 which faces the holes 69. Each of the heat conducting portions 71 is formed to be thicker than the base portions 30 of the first and second grounds 45 and 51. The heat conducting portions 71 are formed by carrying out half-etching on a copper foil material along with the first projecting portions 31 and second projecting portions 32.

In the portable computer 1 and circuit board 13 of the above-described structure, the heat conducting portions 71 formed thicker than the base portions 30 face the holes 69. With this structure, the heat generated by the BGA 14 easily propagate to the heat conducting portions 71 via the holes 69 as indicated by arrow D in FIG. 8. In this manner, the BGA 14 is cooled down efficiently.

Figure 9:
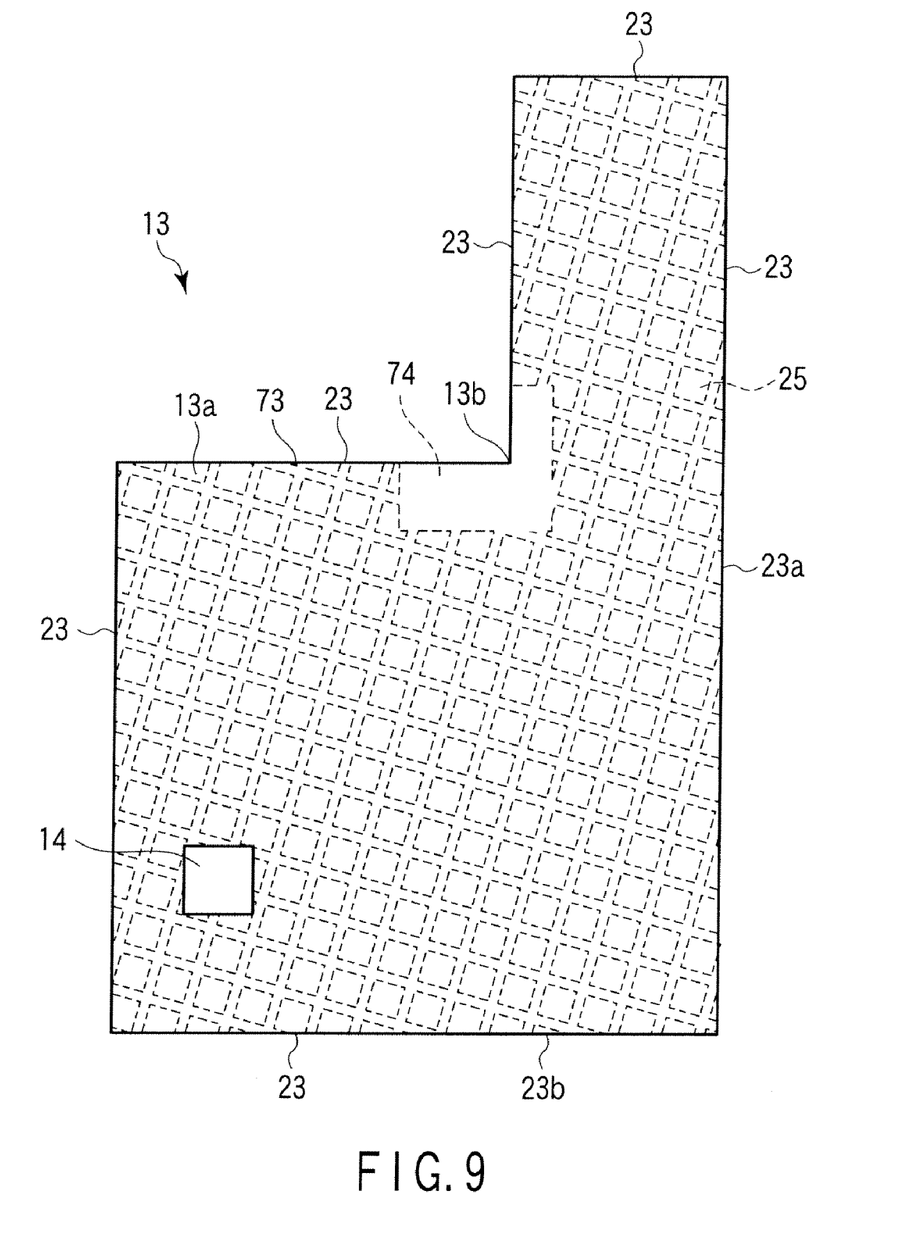
FIG. 9 is an exemplary plan view showing a circuit board according to the fifth embodiment.

Next, the fifth embodiment will now be described. FIG. 9 is a plan view showing a circuit board 13 according to the fifth embodiment. As shown in FIG. 9, the circuit board 13 includes a holder portion 73. The holder portion 73 is a notch made in order to evade a built-in device such as an optical disk drive.

The ground layer 25 of the circuit board 13 includes a reinforcement portion 74. The reinforcement portion 74 is located at a corner portion 13b of the circuit board 13, which is adjacent to the holder portion 73. The reinforcement portion 74 is formed thicker than the base portion 30. The reinforcement portion 74 is formed by carrying out half-etching on a copper foil along with the first projecting portions 31 and second projecting portions 32.

In the portable computer 1 and circuit board 13 of the above-described structure, the reinforcement portion 74 is provided at the corner portion 13b of the circuit board 13, where the stress is easily concentrated. With this structure, the rigidity of the circuit board 13 is improved.

It should be noted that the present invention is not limited to the embodiments described above, but it can be modified into various versions as long as the essence of the invention falls within its scope. For example, the shape of the recess portion 30a is not limited to a square. But, the recess portion 30a may be formed into, for example, a circular or rectangular shape.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic device comprising:
a circuit board housed in a housing, the circuit board comprising an electronic part mounted thereon and provided with a hole at a position covered by the electronic part, the circuit board comprising:
a conductive layer comprising a base portion, a first projecting portion extending along a surface of the base portion, and a second projecting portion extending along the surface of the base portion to cross the first projecting portion;
an insulating layer stacked on the conductive layer; and
a signal line portion stacked on the insulating layer and extending in a direction crossing directions in which the first and second projecting portions extend, wherein
the hole is made through the insulating layer and the conductive layer, and the conductive layer further comprises a heat conducting portion facing the hole and being thicker than the base portion.

2. The electronic device of claim 1, wherein the first and second projecting portion each extend in a direction diagonally crossing an edge portion of the circuit board.

3. The electronic device of claim 1, wherein the first and second projecting portion of the conductive layer each extend from one of the edge portions to another one of the edge portions of the circuit board.

4. The electronic device of claim 2, wherein the second projecting portion extends in a direction crossing at an angle 15 degrees with respect to the edge portion of the circuit board.

5. The electronic device of claim 1, wherein the first and second projecting portions are formed by carrying out half-etching on a copper foil material which gives rise to the conductive layer.

6. The electronic device of claim 1, wherein the insulating layer is overlaid on the conductive layer while tightly attaching to the base portion, the first projecting portion and the second projecting portion.

7. The electronic device of claim 4, wherein the signal line portion extends in the direction at an angle of 0, 45, 90 or 135 degree with respect to the edge portion of the circuit board.

8. The electronic device of claim 1, wherein the circuit board further includes a stack layer portion stacking on the insulating layer and the signal line portion, and
the circuit board is provided with an interlayer connection via configured to electrically connect a top portion of the first and/or second projecting portions of the conductive layer and the stacking layer portion to each other.

9. The electronic device of claim 8, wherein the interlayer connection via is formed by filling a hole which is made through the insulating layer with a conductive paste.

10. A circuit board comprising:
a mounting surface mounted with an electronic part, and making a hole at a position covered by the electronic part;
a conductive layer comprising a base portion, a first projecting portion extending along a surface of the base portion, and a second projecting portion extending along the surface of the base portion to cross the first projecting portion;
an insulating layer stacked on the conductive layer; and
a signal line portion stacked on the insulating layer and extending in a direction crossing directions in which the first and second projecting portions extend, wherein
the hole is made through the insulating layer and the conductive layer, and the conductive layer comprises a heat conducting portion facing the hole and being thicker than the base portion.

* * * * *